US009721763B2

(12) United States Patent
Shareef et al.

(10) Patent No.: US 9,721,763 B2
(45) Date of Patent: Aug. 1, 2017

(54) SYSTEMS AND METHODS FOR PROVIDING GASES TO A PROCESS CHAMBER

(71) Applicant: LAM RESEARCH CORPORATION, Fremont, CA (US)

(72) Inventors: Iqbal Shareef, Fremont, CA (US); Mark Taskar, San Mateo, CA (US); Evangelos Spyropoulos, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 14/753,738

(22) Filed: Jun. 29, 2015

(65) Prior Publication Data

US 2015/0303035 A1    Oct. 22, 2015

Related U.S. Application Data

(63) Continuation of application No. 13/732,054, filed on Dec. 31, 2012, now Pat. No. 9,090,972.

(51) Int. Cl.
*F16K 11/16* (2006.01)
*H01J 37/32* (2006.01)
(Continued)

(52) U.S. Cl.
CPC .. *H01J 37/32449* (2013.01); *C23C 16/45561* (2013.01); *C23C 16/513* (2013.01); *G05D 7/06* (2013.01); *G05D 7/0658* (2013.01); *G05D 11/132* (2013.01); *H01L 21/67069* (2013.01); *H01J 2237/332* (2013.01); *H01J 2237/334* (2013.01); *Y10T 137/0324* (2015.04); *Y10T 137/7722* (2015.04)

(58) Field of Classification Search
CPC ............. G05D 11/132; C23C 16/45561; H01J 37/32449
USPC ................................ 137/605, 606, 607, 884
See application file for complete search history.

(56) References Cited

U.S. PATENT DOCUMENTS

| 4,369,031 A | 1/1983 | Goldman et al. |
| 7,174,263 B2 | 2/2007 | Shajii et al. |

(Continued)

FOREIGN PATENT DOCUMENTS

| CN | 101496144 A | 7/2009 |
| CN | 102832096 A | 12/2012 |

OTHER PUBLICATIONS

Office Action corresponding to Chinese Patent Application No. 201310754016.7, 10 pages.

*Primary Examiner* — Reinaldo Sanchez-Medina

(57) ABSTRACT

A gas supply system for providing a plurality of process gases to a process chamber includes a plurality of mass flow controllers each arranged to receive a respective subset of the plurality of process gases. Each of the respective subsets includes more than one of the process gases, and at least one of the process gases is provided to more than one of the plurality of mass flow controllers. Respective valves are arranged upstream of each of the plurality of mass flow controllers to selectively provide the respective subsets to the mass flow controllers. A first quantity of the plurality of mass flow controllers is less than a total number of the plurality of process gases to be supplied to the process chamber. The first quantity is equal to a maximum number of the plurality of process gases to be used in the process chamber at any one time.

14 Claims, 4 Drawing Sheets

(51) Int. Cl.
*G05D 11/13* (2006.01)
*G05D 7/06* (2006.01)
*C23C 16/455* (2006.01)
*C23C 16/513* (2006.01)
*H01L 21/67* (2006.01)

(56) References Cited

U.S. PATENT DOCUMENTS

| | | | |
|---|---|---|---|
| 7,360,551 | B2 | 4/2008 | Lull et al. |
| 8,397,668 | B2 * | 3/2013 | Kobayashi ........ H01J 37/32082 |
| | | | 118/715 |
| 9,090,972 | B2 * | 7/2015 | Shareef .................... G05D 7/06 |
| 9,305,810 | B2 * | 4/2016 | Singh ................ H01L 21/67017 |
| 2001/0013363 | A1 | 8/2001 | Kitayama et al. |
| 2005/0241763 | A1 | 11/2005 | Huang et al. |
| 2006/0280867 | A1 * | 12/2006 | Park ........................ C23C 16/34 |
| | | | 427/248.1 |
| 2007/0221129 | A1 | 9/2007 | Bae et al. |
| 2009/0061541 | A1 | 3/2009 | Moriya et al. |
| 2012/0152364 | A1 | 6/2012 | Hashimoto et al. |
| 2013/0255782 | A1 | 10/2013 | Shareef et al. |

\* cited by examiner

SYSTEMS AND METHODS FOR PROVIDING GASES TO A PROCESS CHAMBER

CROSS-REFERENCE TO RELATED APPLICATIONS

The present disclosure is a continuation of U.S. patent application Ser. No. 13/732,054 filed on Dec. 31, 2012. The entire disclosure of the application referenced above is incorporated herein by reference.

BACKGROUND OF THE INVENTION

The present invention relates to methods and apparatuses for processing semiconductor substrates (e.g., wafers, flat panel displays, etc.). More particularly, the present invention relates to methods and apparatuses for supplying process gases to a substrate processing chamber configured for processing such substrates.

Substrate processing involves, among other process steps, the selective deposition and removal of materials from the substrate surface. Many deposition and etching processes employ process source gases to perform the aforementioned deposition and etching. Plasma-enhanced etching is an example substrate processing process that employs a plurality of process gases in one or more processing steps.

In the following disclosure, plasma-enhanced etching and plasma-enhanced etching chambers are employed to illustrate various concepts and implementation examples. It should be understood, however, that the concepts and embodiments discussed herein may apply to any processing system or technology that employs one or more process gases in the processing of substrates.

In a typical plasma processing chamber, a plurality of source gases may be made available to the chamber. The available source gases are provided to a gas delivery system associated with the plasma processing chamber. Depending on the recipe requirements, a subset of the available gases may be provided by the gas delivery system to the chamber during any given process step.

For example, a recipe may call for 20 sccm (standard cubic centimeter) of $N_2$, 60 sccm of $CHF_3$, and 30 sccm of Ar to be delivered to chamber during a given recipe step. To control (i.e., turning on/off and/or meter) the flow of the required gases, each feed line that carries a specific gas from a gas feed source to the chamber may be equipped with a mass flow controller (MFC).

Thus a chamber that has 16 possible process gases available to it may be equipped with a gas supply system that employs 16 MFCs, with each MFC turning on/off and metering one of the 16 available gases. The individual constituent gases that flow during a particular process step (such as the aforementioned $N_2$, $CHF_3$ and Ar) may be mixed in a mixing manifold prior to being delivered to the chamber.

FIG. 1 shows an example prior art gas supply arrangement 100 whereby 16 MFCs (102A-102P) are coupled to 16 gas supply lines (104A-104P respectively). Each MFC can control the flow of the process gas to which it is coupled. By turning on/off an MFC and/or using that MFC to meter the flow, a process gas may be excluded from a processing step or provided to the chamber at the flow rate specified by the process recipe.

Although this arrangement has proven useful in the past, improvements can be made. With reference to the previously mentioned example, the use of 16 MFCs to control the 16 supplied gases dictates that the gas supply system and the enclosure 110 therefor be of a certain size to physically accommodate at least the 16 MFCs. The use of 16 MFCs also dictates that the mixing manifold 112 be sufficiently long to couple to the outlets of the 16 MFCs.

Further, the 16 MFCs and the large mixing manifold increase the gas supply system footprint as well as give rise to a large gas supply enclosure interior volume. Since environmental remediation requirements often necessitate the scrubbing of any gaseous material that exists in or is exhausted from the interior volume of the gas supply system enclosure, the larger interior volume results in increased cost as a larger volume of gaseous material needs to be scrubbed.

Further, a larger gas supply system enclosure requires the gas supply system to be located further away (relative to a smaller gas supply system, for example) from the chamber. As a consequence, a longer chamber gas supply line connecting the mixing manifold to the chamber is often required.

Still further, certain recipes require the pulsing of the supplied gases. For example, a recipe may require alternately pulsing between gas mixture 1 and gas mixture 2. In a pulsing application, the larger mixing manifold and the longer chamber gas supply line increase the gas residence time, making fast switching from one gas mixture to another gas mixture impractical.

For at least these reasons, improved gas supply arrangements for substrate processing chambers and methods therefor are desired.

BRIEF SUMMARY OF THE INVENTION

The invention relates, in an embodiment, to a gas supply subsystem for providing a set of process gases to a substrate processing chamber, the set of process gases being a subset of a plurality of process gases available to the substrate processing chamber. There is included a plurality of process gas conduits providing a plurality of process gases. The invention also includes, in an embodiment, a plurality of mass flow controllers having fewer mass flow controllers than a total number of process gases in the plurality of process gases, wherein at least a first process gas of the plurality of process gases is under selective gas flow control by at least two mass flow controllers of the plurality of mass flow controllers and wherein at least a first mass flow controller of the at least two mass flow controllers also provides selective gas flow control to a second process gas of the plurality of process gases.

In another embodiment, the invention relates to a method of providing a set of process gases to a substrate processing chamber, the set of process gases being a subset of a plurality of process gases available to the substrate processing chamber. The method includes providing a first process gas of the plurality of process gases to a mass flow controller, whereby the mass flow controller controls a flow of the first process gas to the substrate processing chamber. The method also includes opening thereafter an upstream valve to vacuum to flush at least a portion of the first gas from the mass flow controller, wherein the upstream valve is in gaseous communication with an inlet of the mass flow controller. The method also includes providing thereafter a second process gas of the plurality of process gases to the mass flow controller, whereby the mass flow controller controls a flow of the second process gas to the substrate processing chamber.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
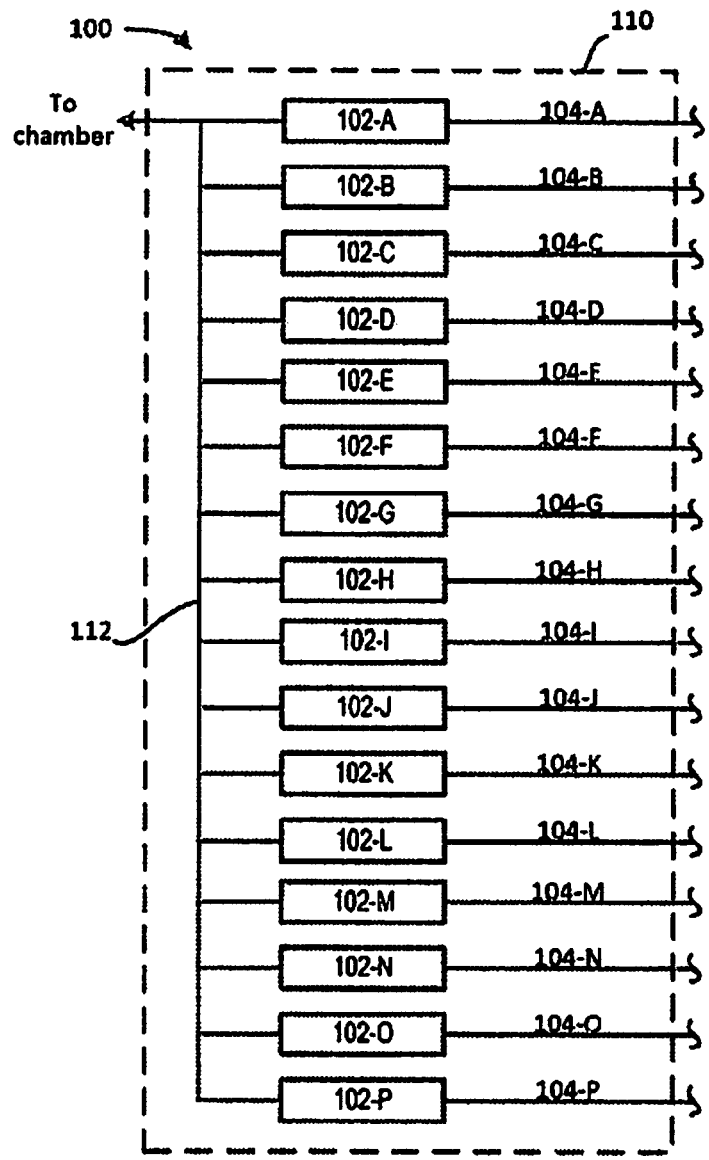
FIG. 1 shows an example prior art gas supply arrangement whereby 16 MFC5 (102A-102P) are coupled to 16 gas supply lines (104A-104P respectively).

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described herein below, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Embodiments of the invention relate to methods and apparatuses for providing a set of process gases to a substrate processing chamber that is configured to process a substrate. The inventors herein recognize that although many process gases may be made available to a typical substrate processing chamber, it is exceedingly rare, if ever, that a process recipe (e.g., a recipe for either deposition or etching) may require more than a subset (and often a small subset) of the process gases available to the substrate processing system. This is because some process gas combinations are incompatible or are simply not used together for substrate processing.

Accordingly, it is recognized that if a mass flow controller that controls (i.e., turn on/off and/or meter) gas flow can be coupled such that the mass flow controller (MFC) can perform selective gas flow control for more than one process gas, the total number of MFCs can be reduced. As the term is employed herein, an MFC is said to perform selective gas flow control for a plurality of process gases if the MFC can be coupled, at any given time, to any one of the plurality of process gases and can control (i.e., turn on/off and/or meter) the process gas that it currently receives.

In one or more embodiments, an innovative arrangement is proposed whereby the number of MFCs required to supply process gases to the chamber is smaller than the total number of process gases available to the chamber. As the term is employed herein, the "available process gases" represent all possible process gases that can be supplied to the chamber, although a given recipe may call for only a subset of the available process gases.

In order to reduce the number of MFCs such that there are fewer MFCs than the total number of available process gases, at least one, or some, or all the MFCs may be coupled to receive and control more than one process gas each. In one or more embodiments, a given process gas may be provided to more than one MFC such that any of the MFCs to which the gas is provided may be employed to control the flow of that process gas.

In one or more embodiments, the available process gases or a subset of the available process gases may be multiplexed on the inlet side of a given MFC such that although more than one process gas may be available to a given MFC, only one process gas (or none) is controlled by the MFC at any given time.

Further, embodiments of the invention propose a set of lock-out combinations such that certain process gas combinations are not multiplexed at the inlet side of a given MFC. Lock-out capability is especially useful to prevent harmful or damaging unintentional reaction between/among residues of incompatible gases inside the MFC.

In one or more embodiments, a pump-purge procedure is proposed to shorten the time required to switch from one process gas to another process gas through a given MFC. In an embodiment, an upstream valve is coupled to the inlet of the MFC. The upstream valve can open to vacuum such that any process gas previously flowed through the MFC prior to gas switching may be vacuumed out. This vacuuming minimizes any residual prior gas. Thereafter, the upstream valve may be closed to the vacuum before, contemporaneous with, or shortly after a second process gas is flowed to the inlet side of the MFC. In one or more embodiments, a purging gas (such as an inert gas or a process-compatible gas that is relatively non-reactive with either the prior process gas or the subsequent process gas) may be employed to purge the MFC and/or conduits coupled therewith prior to switching from the prior process gas to the subsequent process gas.

Since fewer MFCs are employed, the mixing manifold that couples to the outlets of the MFCs can be shortened. Further the footprint of the gas supply system may be made smaller since fewer MFCs are required. The smaller gas supply system may be located closer to the chamber, thereby reducing the length of the mixing-manifold-to-chamber gas supply line. When one or both of the mixing manifold and the mixing-manifold-to-chamber gas supply line is/are shortened, the gas residence time is reduced and faster gas switching is possible. In an embodiment, gas switching may be made sufficiently fast to make gas pulsing between various gas mixtures possible to accommodate a processing recipe that calls for such gas pulsing.

Although multiplexing the available process gases (or subsets thereof) at the inlet of the MFCs requires additional valves and conduits, the inventors herein recognize that the conduit length and footprint limitation on upstream side of the MFCs are less critical since there is no gas pulsing or gas switching on the upstream side. The reduction in the number of MFCs employed, the reduction of the length of the mixing manifold and/or the reduction of the length of the mixing-manifold-to-chamber gas supply line represent an advantageous trade-off.

The features and advantages of embodiments of the invention may be better understood with reference to the figures and discussions that follow.

Figure 2:
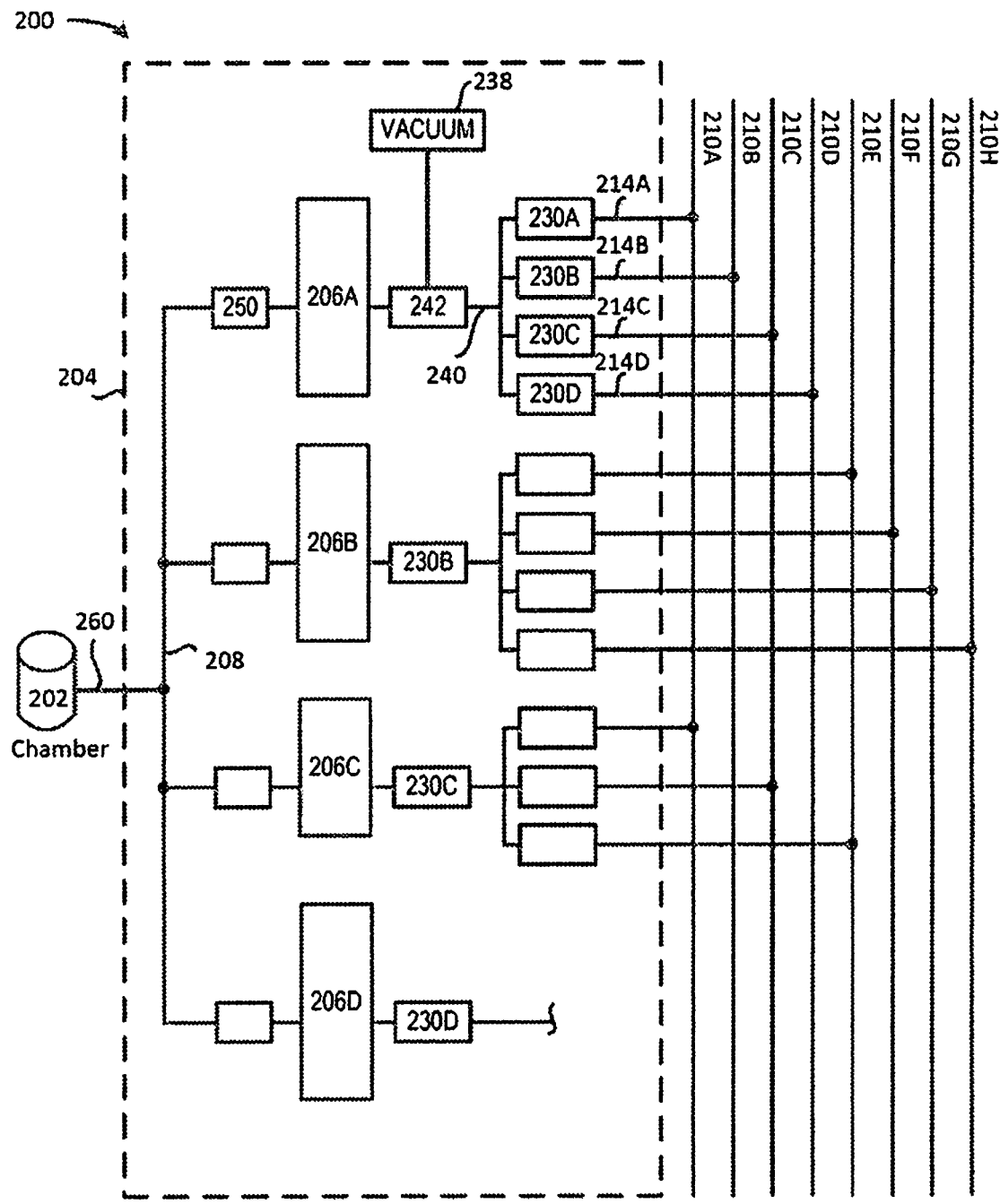
FIG. 2 shows, in accordance with an embodiment of the present invention, a simplified representation of a portion of a plasma process system, including a plasma processing chamber and a gas supply system.

FIG. 2 shows, in accordance with an embodiment of the present invention, a simplified representation of a portion of a plasma process system 200, including a plasma processing chamber 202 and a gas supply system 204. Gas supply system 204 includes four example MFCs 206A, 206B, 206C, and 206D, the outlets of which are coupled to a mixing manifold 208. Available supply gases 210A-210H represent 8 example available supply gases, various combinations of which may be made available to chamber 202. Although only 8 available supply gases and 4 MFCs are illustrated, it should be understood that a gas supply system may have any arbitrary number of MFCs and handle any number of available supply gases.

In the example of FIG. 2, suppose it has been determined (for the purpose of explaining the present example) that recipes executing in chamber 202 employ at most 4 process gases at any given time. Accordingly, only four MFCs are provided to reduce the number of MFCs and to shorten the length of mixing manifold 208 as well as to shorten the mixing-manifold-to-chamber gas supply line 260 (since the footprint of gas supply system 204 is reduced).

As can be seen, MFC 206A is coupled to gas supply lines 210A, 210B, 210C, and 210D (via gas conduit segments 214A, 214B, 214C, and 214D respectively) to perform selective gas flow control for the process gases provided via gas supply lines 210A, 210B, 210C, and 210D. An primary valve 230A is provided on gas conduit segment 214A to at least turn on/off the gas flow that is provided via gas supply line 210A and gas conduit segment 214A to MFC 206A. Similar primary valves 230B, 230C, and 230D may be provided on gas conduit segments 214B, 214C, and 214D respectively. The primary valves 230A-230D either shut off all gas input into MFC 206A or multiplex at most one of the gases from gas supply lines 210A, 210B, 210C, and 210D to the inlet side of MFC 206A.

As can be seen in FIG. 2, the outputs of primary valves 230A, 230B, 230C, and 230D are coupled to a common MFC inlet manifold 240, which is in gaseous communication with the inlet side of MFC 206A. In one or more embodiments, upstream valve 242 can optionally be provided to open the interior of MFC 206A and common MFC inlet manifold 240 to vacuum (238 as shown in FIG. 2) in order to more speedily evacuate any gas that exists in MFC 206A and common MFC inlet manifold 240, thereby facilitating faster gas switching by MFC 206A. If desired, upstream valve 242 may also perform the additional function of a shut-off valve. It should be understood that upstream valves and similar vacuum purge capability may be provided with MFCs 206B, 206C, and 206D if pump-purge is implemented. This optional pump-purge aspect is discussed later herein.

MFC 206B is coupled to gas supply lines 210E, 210F, 210G, and 210H via similarly configured gas conduit segments and primary valves. MFC 206C is coupled to gas supply lines 210A, 210C, and 210G via similarly configured gas conduit segments and primary valves. MFC 206D is coupled to gas supply lines 210A, 210B, 210C, 210D, 210E, 210F, 210G, and 210H via similarly configured gas conduit segments and primary valves. As can be seen in FIG. 2, a given MFC can be coupled to receive, in a multiplexed manner on its inlet side, any subset of the available supply gases or to receive all of the available supply gases. As mentioned, optional upstream valves may also be provided on the common inlet manifold coupled to the inlet side of each MFC.

In one or more embodiments, an optional downstream valve 250 may also be provided at the outlet side of MFC 206A. Optional downstream valve 250 may perform the function of a shut off valve and/or a vacuum purge valve in the same manner discussed in connection with upstream valve 242. If desired, an upstream valve may be provided with each of MFCs 206A, 206B, 206C, and 206D.

As can be seen in FIG. 2, although there are 8 available process gases, only 4 MFCs (206A, 206B, 206C, and 206D) are required since it has been determined that recipes executing in chamber 202 employ at most four process gases. Since fewer MFCs are required, the length of mixing manifold 208 may be reduced. A shorter mixing manifold 208 has less volume, thereby reducing the gas residence time to enable faster gas switching by MFC 206A and by gas supply system 204.

Further, since fewer MFCs are employed, the footprint of gas supply system 204 may be reduced. A smaller gas supply system 204 may be placed closer to chamber 202, thereby reducing the length of the mixing-manifold-to-chamber gas line 260. A shorter mixing-manifold-to-chamber gas line 260 has less volume, thereby reducing gas residence time to enable faster gas switching by gas supply system 204.

Additionally, since a given process gas (such as the process gas supplied via gas line 210G) may be controlled by more than one MFC (e.g., by MFC 206B and MFC 206C in the example of FIG. 2), if one of the MFCs (such as MFC 206B for example) needs to be taken offline for maintenance, processing may continue since the process gas supplied via gas line 210G may continue to be metered and supplied to the chamber via MFC 206C.

Figure 3:
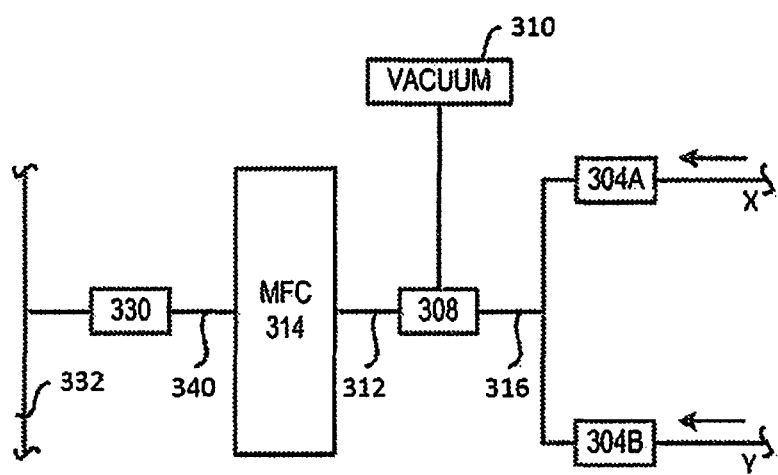
FIG. 3 shows an example MFC coupled to receive two possible gas supplies X and Y to facilitate discussion of the optional pump-purge aspect of the invention.

As mentioned earlier, an optional pump-purge procedure may be implemented to increase the gas switching speed by an MFC or by the gas supply system. FIG. 3 shows an example MFC 314 coupled to receive two possible gas supplies X and Y via primary valves 304A and 304B respectively. Upstream valve 308 can be configured to vent MFC 314, inlet conduit 312 of MFC 314 and common inlet manifold 316 to vacuum 310. Alternatively, upstream valve 308 may be opened to let gas from common inlet manifold 316 to flow to inlet conduit 312 or to shut off gas from flowing out of common inlet manifold 316 to either inlet conduit 312 or vacuum 310.

Suppose that a given step of the process requires the flow of gas X (via open primary valve 304A and closed primary valve 304B) through MFC 314. In this case, upstream valve 308 opens to allow gas from common inlet manifold 316 to flow through to inlet conduit 312. MFC 314 thus performs selective flow control for gas X under this set-up.

If the subsequent process step (or a subsequent sub-step of the current process step) calls for the selective control of gas Y (i.e., pulsing from gas X to gas Y), primary gas valve 304A may be closed to first shut off the supply of gas X to MFC 314. Subsequently, upstream valve 308 may vent to vacuum 310, thereby allowing gas X residue in MFC 314, in inlet conduit 312 and/or in common inlet manifold 316 to be exhausted to vacuum 310.

If desired, primary valve 304B may be turned on to allow gas Y to flush common inlet manifold 316 with gas Y. Thereafter, upstream valve 308 may be switched to a flow-through mode to allow common inlet manifold 316 to be in gaseous communication with inlet conduit 312. If primary valve 304B is already turned on, gas Y would be provided to MFC 314. Alternatively, primary valve 304B may be kept off until after upstream valve 308 is switched from a vacuum purging mode to a flow-through mode. Since gas X residue in MFC 314, in inlet conduit 312 and/or in common inlet manifold 316 has been exhausted to vacuum 310, gas switching time from gas X to gas Y is shortened and any inadvertent or undesirable mixing of gas X and gas Y is minimized.

FIG. 3 also shows an optional downstream valve 330, which is coupled between the output of MFC 314 and mixing manifold 332. Vacuum purging may be performed by downstream valve 330 to evacuate gas X residue in the outlet conduit that couples to the output side of MFC 314 or from mixing manifold 332. If both upstream valve 308 and downstream valve 330 exhaust to vacuum prior to switching from gas X to gas Y, substantially all gas X residue may be evacuated from common inlet manifold 316, inlet conduit 312, MFC 314, output conduit 340 and mixing manifold 332 prior to the flowing of gas Y via primary valve 304B.

Figure 4:
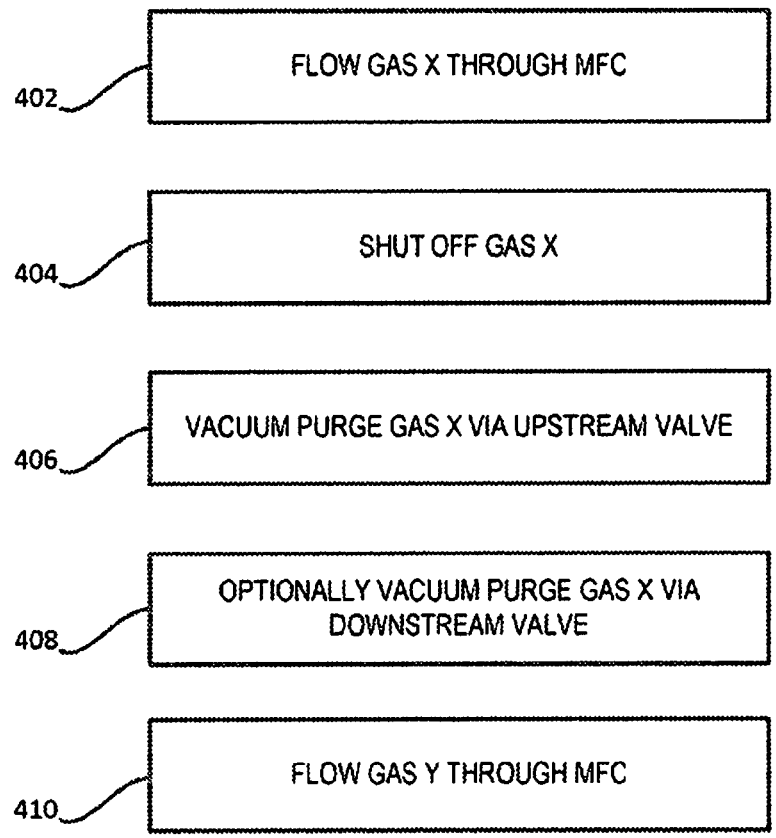
FIG. 4 shows, in accordance with an embodiment of the present invention, a simplified flowchart of the steps for performing the optional pump-purge.

FIG. 4 shows, in accordance with an embodiment of the present invention, a simplified flowchart of the steps for performing the optional pump-purge. In this example, gas switching from gas X to gas Y is performed. In step 402, gas X is flowed through the MFC. In step 404, the flow of gas X is shut off (e.g. via the primary valve that controls the flow of gas X to the MFC). In step 406. vacuum purge is performed to remove gas X residue from the MFC and from the MFC inlet-side conduit(s) by opening the upstream valve to vacuum.

In step 408, vacuum purge is optionally performed to remove gas X residue from the MFC and from the MFC outlet side conduit and/or from the mixing manifold by opening the downstream valve to vacuum.

In step 410, gas Y is flowed to the MFC by opening the primary valve that controls the flow of gas Y to the MFC. The upstream valve is in a flow-through mode to allow gas Y to be supplied from the common inlet manifold to the MFC. The downstream valve (if provided) is in flow-through mode to allow gas Y to exit the MFC into the mixing manifold. The primary valve that controls the flow of gas Y may be turned on slightly prior to, at the same time as, or slight after the switching of the upstream and/or downstream valves to a flow-through mode (from the vacuum purge mode).

As can be appreciated from the foregoing, embodiments of the invention substantially reduce the gas supply system footprint by reducing the number of MFCs to be fewer than the number of available supply gases. With fewer MFCs in the gas supply system, the length of the mixing manifold may be reduced, thereby reducing the mixing manifold volume and the gas residence time therein to improve gas switching time.

Further, the smaller gas supply system footprint allows the gas supply system to be located closer to the plasma chamber, thereby reducing the length of the mixing-manifold-to-chamber gas line (such as gas line 260 of FIG. 2). The shorter mixing-manifold-to-chamber gas line length also reduces the volume therein, thereby reducing the gas residence time therein and improving the gas switching time. Such faster gas switching time makes it possible to implement gas pulsing recipes where the supply gases can be switched in the multiple seconds or sub-seconds range.

Since a given process gas may be under selective gas flow control by more than one MFC, system reliability is improved. If a given MFC is taken offline for maintenance, that process gas may be controlled and supplied to the chamber via another MFC, thereby allowing processing to continue. This is unlike the situation in prior art FIG. 1, wherein each process gas is controlled by its own MFC and the unavailability of an MFC would render flow control for that process gas unavailable for processing purposes.

While this invention has been described in terms of several preferred embodiments, there are alterations, permutations, and equivalents, which fall within the scope of this invention. If the term "set" is employed herein, such term is intended to have its commonly understood mathematical meaning to cover zero, one, or more than one member. The invention should be understood to also encompass these alterations, permutations, and equivalents. It should also be noted that there are many alternative ways of implementing the methods and apparatuses of the present invention. Although various examples are provided herein, it is intended that these examples be illustrative and not limiting with respect to the invention.

What is claimed is:

1. A gas supply system for providing a plurality of process gases to a process chamber, the gas supply system comprising:
   a plurality of mass flow controllers each arranged to receive a respective subset of the plurality of process gases, wherein each of the respective subsets of the plurality of process gases includes more than one of the plurality of process gases, and wherein at least one of the process gases is provided to more than one of the plurality of mass flow controllers;
   a respective plurality of valves arranged upstream of each of the plurality of mass flow controllers to selectively provide the respective subsets of the plurality of process gases to the plurality of mass flow controllers, wherein (i) each of the mass flow controllers is connected to a plurality of the valves, (ii) each of the plurality of valves is independently connected to a respective source of one of the process gases, and (iii) each of the plurality of valves is independently connected to a respective one of the plurality of mass flow controllers such that each of the plurality of valves is connected to only one of the plurality of mass flow controllers; and
   a mixing manifold arranged between the plurality of mass flow controllers and the process chamber, the mixing manifold configured to receive and mix respective process gases from each of the plurality of mass flow controllers prior to providing the respective process gases to the process chamber,
   wherein a first quantity of the plurality of mass flow controllers is less than a total number of the plurality of process gases to be supplied to the process chamber, and
   wherein the first quantity is equal to a maximum number of the plurality of process gases to be used in the process chamber at any one time.

2. The gas supply system of claim 1, further comprising a first upstream valve coupled to an inlet of at least one of the plurality of mass flow controllers, wherein said first upstream valve selectively couples said inlet to (i) a vacuum and (ii) a conduit that provides the respective subset of the plurality of process gases to said inlet.

3. The gas supply system of claim 1, wherein the respective subset of the plurality of process gases received by at least one of the plurality of mass flow controllers includes the total number of the plurality of process gases to be supplied to the process chamber.

4. The gas supply system of claim 1, wherein none of the respective subsets of the plurality of process gases is the same as any others of the respective subsets of the plurality of process gases.

5. The gas supply system of claim 1, wherein at least two of the respective subsets of the plurality of process gases do not include any of the same process gases.

6. The gas supply system of claim 1, wherein at least one of the plurality of process gases includes an etching source gas.

7. The gas supply system of claim 1, wherein at least one of the plurality of process gases includes a deposition source gas.

8. A method for providing a plurality of process gases to a process chamber, the method comprising:
   receiving, at a plurality of mass flow controllers, a respective subset of the plurality of process gases, wherein each of the respective subsets of the plurality of process gases includes more than one of the plurality of process gases, and wherein at least one of the process gases is provided to more than one of the plurality of mass flow controllers; and
   selectively providing, using a respective plurality of valves arranged upstream of each of the plurality of mass flow controllers, the respective subsets of the plurality of process gases to the plurality of mass flow controllers, wherein (i) each of the mass flow controllers is connected to a plurality of the valves, (ii) each of the plurality of valves is independently connected to a respective source of one of the process gases, and (iii) each of the plurality of valves is independently connected to a respective one of the plurality of mass flow controllers such that each of the plurality of valves is connected to only one of the plurality of mass flow controllers; and
   providing respective process gases from each of the plurality of mass flow controllers to a mixing manifold arranged between the plurality of mass flow controllers and the process chamber, the mixing manifold configured to receive and mix the respective process gases from each of the plurality of mass flow controllers prior to providing the respective process gases to the process chamber,
   wherein a first quantity of the plurality of mass flow controllers is less than a total number of the plurality of process gases to be supplied to the process chamber, and
   wherein the first quantity is equal to a maximum number of the plurality of process gases to be used in the process chamber at any one time.

9. The method of claim 8, further comprising selectively coupling, using a first upstream valve, an inlet of at least one of the plurality of mass flow controllers to (i) a vacuum and (ii) a conduit that provides the respective subset of the plurality of process gases to said inlet.

10. The method of claim 8, wherein the respective subset of the plurality of process gases received by at least one of the plurality of mass flow controllers includes the total number of the plurality of process gases to be supplied to the process chamber.

11. The method of claim 8, wherein none of the respective subsets of the plurality of process gases is the same as any others of the respective subsets of the plurality of process gases.

12. The method of claim 8, wherein at least two of the respective subsets of the plurality of process gases do not include any of the same process gases.

13. The method of claim 8, wherein at least one of the plurality of process gases includes an etching source gas.

14. The method of claim 8, wherein at least one of the plurality of process gases includes a deposition source gas.

* * * * *